US010062428B2

(12) United States Patent
Lee (10) Patent No.: US 10,062,428 B2
(45) Date of Patent: Aug. 28, 2018

(54) REFRESH TIMING GENERATION CIRCUIT, REFRESH CONTROL CIRCUIT AND SEMICONDUCTOR APPARATUS WITH EFFICIENT CURRENT CONSUMPTION

(71) Applicant: SK hynix Inc., Incheon-si, Gyeonggi-do (KR)

(72) Inventor: Hyun Sung Lee, Incheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/462,989

(22) Filed: Mar. 20, 2017

(65) Prior Publication Data

US 2018/0114565 A1  Apr. 26, 2018

(30) Foreign Application Priority Data

Oct. 20, 2016 (KR) .......... 10 2016 0136302

(51) Int. Cl.
| G11C 7/00 | (2006.01) |
| G11C 11/406 | (2006.01) |
| G11C 11/4076 | (2006.01) |
| G11C 11/408 | (2006.01) |
| G06F 3/06 | (2006.01) |

(52) U.S. Cl.
CPC ........ *G11C 11/40615* (2013.01); *G06F 3/064* (2013.01); *G06F 3/0619* (2013.01); *G06F 3/0659* (2013.01); *G06F 3/0673* (2013.01); *G11C 11/4076* (2013.01); *G11C 11/4087* (2013.01)

(58) Field of Classification Search
None
See application file for complete search history.

(56) References Cited

U.S. PATENT DOCUMENTS

| 5,430,681 A * | 7/1995 | Sugawara ............ G11C 5/141 365/222 |
| 2013/0024737 A1* | 1/2013 | Marinissen ...... G01R 31/31850 714/727 |
| 2016/0027491 A1 | 1/2016 | Kim |

* cited by examiner

*Primary Examiner* — Son Dinh
*Assistant Examiner* — Sultana Begum
(74) *Attorney, Agent, or Firm* — William Park & Associates Ltd.

(57) ABSTRACT

A semiconductor apparatus may be provided. The semiconductor apparatus may include a base die. The semiconductor apparatus may include a plurality of core dies stacked on the base die, and each including a plurality of memory blocks. The base die or each of the core dies may include a refresh timing generation circuit configured to delay a refresh pulse, and output delayed signals as a plurality of refresh timing signals.

17 Claims, 7 Drawing Sheets

REFRESH TIMING GENERATION CIRCUIT, REFRESH CONTROL CIRCUIT AND SEMICONDUCTOR APPARATUS WITH EFFICIENT CURRENT CONSUMPTION

CROSS-REFERENCES TO RELATED APPLICATION

The present application claims priority under 35 U.S.C. § 119(a) to Korean application number 10-2016-0136302, filed on Oct. 20, 2016, in the Korean Intellectual Property Office, which is incorporated herein by reference in its entirety.

BACKGROUND

1. Technical Field

Various embodiments may generally relate to a semiconductor circuit, and more particularly, to a refresh timing generation circuit, a refresh control circuit and a semiconductor apparatus including the same.

2. Related Art

A semiconductor memory may consist of a plurality of dies which are stacked and electrically coupled through a through-electrode. Such a semiconductor memory can increase the number of input and output (input/output) units, thereby increasing a bandwidth. For example, the semiconductor memory may consist of a HBM (High Bandwidth Memory).

Such an architecture implementing the plurality of dies stacked therein may increase current consumption. In particular, when refresh operations are performed on the plurality of dies, power consumption may momentarily increase. Thus, in order to prevent a problem caused by the momentary increase in power consumption, it is important to efficiently manage the current consumption by the refresh operations.

SUMMARY

In an embodiment of the present disclosure, a refresh timing generation circuit may be provided. The refresh timing generation circuit may be configured to delay a refresh pulse, and output delayed signals as a plurality of refresh timing signals.

In an embodiment of the present disclosure, a refresh control circuit may be provided. The refresh control circuit may include a refresh timing generation circuit configured to delay a refresh pulse, and output delayed signals as a plurality of refresh timing signals.

In an embodiment of the present disclosure, a semiconductor apparatus may be provided. The semiconductor apparatus may include a refresh timing generation circuit configured to delay a refresh pulse, and output delayed signals as a plurality of refresh timing signals.

DETAILED DESCRIPTION

Various embodiments may be directed to a refresh timing generation circuit, a refresh control circuit and a semiconductor apparatus including the same, which may be capable of efficiently managing current consumption by a refresh operation.

Hereinafter, a refresh timing generation circuit, a refresh control circuit and a semiconductor apparatus including the same according to the present disclosure will be described below with reference to the accompanying drawings through examples of embodiments.

Figure 1:
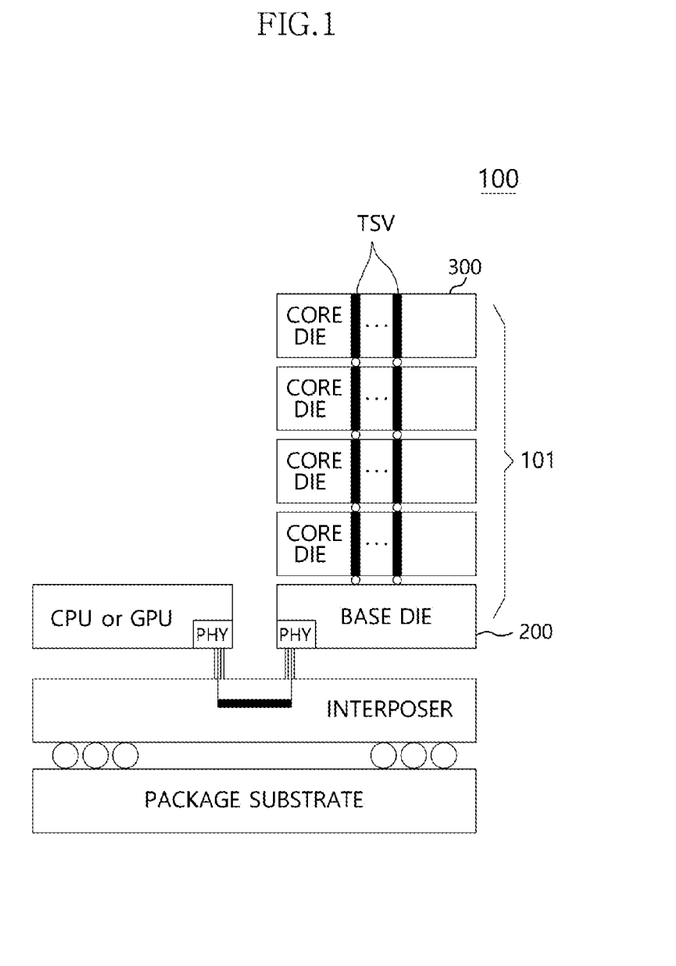
FIG. 1 is a diagram illustrating a representation of an example of a configuration of a memory system according to an embodiment.

A memory system 100 according to an embodiment may be embodied by a system-in-package module, a multi-chip-package module or a system-on-chip module, or embodied by a package-on-package module including a plurality of packages.

Referring to FIG. 1, the memory system 100 according to a present embodiment may include a semiconductor memory 101, that is, a stacked semiconductor memory 101 having a plurality of dies stacked therein, a memory controller (CPU or GPU), an interposer and a package substrate.

The semiconductor memory 101 may include a HBM (High Bandwidth Memory) in which a plurality of dies are stacked and electrically coupled through a TSV (Through-Silicon Via). The HBM may increase the number of input and output (input/output) units, thereby raising a bandwidth.

The interposer may be coupled to the top of the package substrate.

The semiconductor memory 101 and the memory controller (CPU or GPU) may be coupled to the top of the interposer. The memory controller may include a central processing unit CPU and or a graphics processing unit GPU.

Physical regions PHY of the semiconductor memory 101 and the memory controller (CPU or GPU) may be coupled through the interposer.

The semiconductor memory 101 may include a plurality of dies stacked therein.

The plurality of dies may include a base die 200 and a plurality of core dies 300.

The base die 200 and the plurality of core dies 300 may be electrically coupled through a plurality of through-electrodes (for example, TSV: Through Silicon Via).

Figure 2:
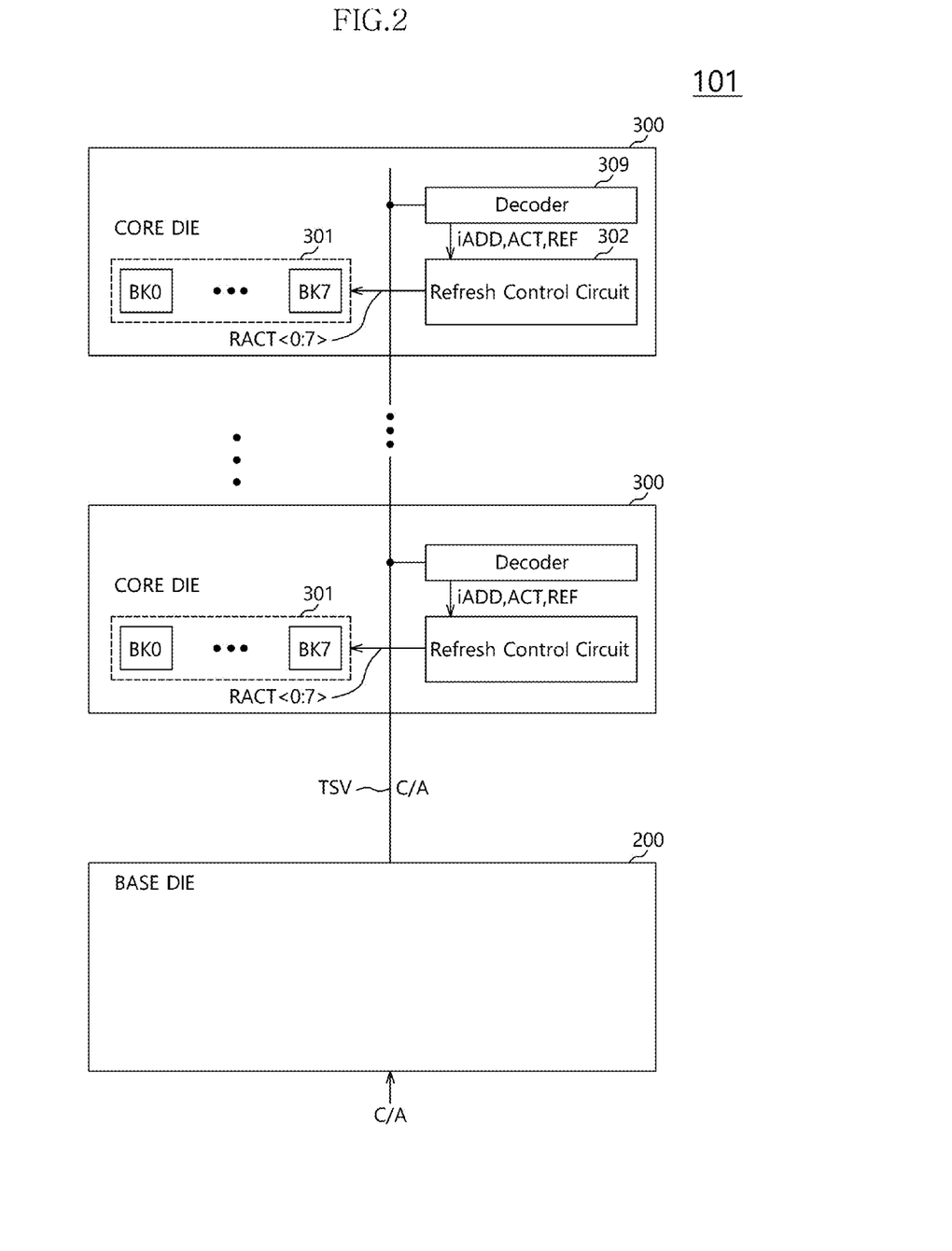
FIG. 2 is a diagram illustrating a representation of an example of a configuration of a semiconductor apparatus according to an embodiment.

Referring to FIG. 2, a semiconductor apparatus including a semiconductor memory 101 according to a present embodiment may include the base die 200 and the plurality of core dies 300.

The base die 200 may provide a command and address (command/address) signal C/A inputted through an external pin to the plurality of core dies 300 through the TSVs.

Each of the core dies 300 may include a memory region 301, a refresh control circuit 302 and a decoder 309.

The memory region 301 may include a plurality of memory blocks, for example but not limited to, a plurality of memory banks BK0 to BK7.

The plurality of memory banks BK0 to BK7 may sequentially perform refresh operations according to active signals RACT<0:7>.

For example, the plurality of memory banks BK0 to BK7 may perform refresh operations in order of BK0, BK1, . . . , BK7.

The decoder 309 may generate an internal address iADD, an active command ACT and a refresh command REF by decoding the command/address signal C/A.

The refresh control circuit 302 may generate the active signals RACT<0:7> which are enabled with a preset time difference therebetween, according to the internal address iADD, the active command ACT and the refresh command REF.

The active signals RACT<0:7> may be row active signals for activating predetermined word lines of the respective memory banks BK0 to BK7.

For example, the active signals RACT<0:7> may be enabled with the preset time difference therebetween in order of RACT0, RACT1, . . . , RACT7.

Figure 3:
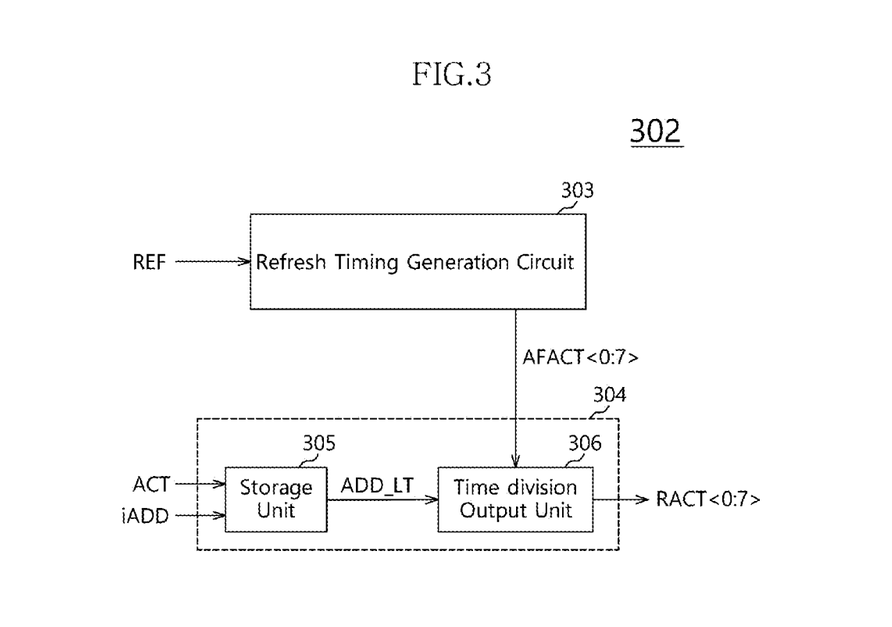
FIG. 3 is a diagram illustrating a representation of an example of a configuration of a refresh control unit of FIG. 2.

Referring to FIG. 3, the refresh control circuit 302 may include a refresh timing generation circuit 303 and an active control circuit 304.

The refresh timing generation circuit 303 may generate a pre-refresh timing signal by repetitively delaying a pulse signal with a feedback loop passing through a delay, the pulse signal being generated according to the refresh command REF. Then, the refresh timing generation circuit 303 may select pulses of the pre-refresh timing signal according to a preset order, and output the selected pulses as a plurality of refresh timing signals AFACT<0:7>.

The active control circuit 304 may store the internal address iADD corresponding to the active command ACT, vary the value of the stored address, and output the varied address as the active signals RACT<0:7> which are processed in a time division manner according to the plurality of refresh timing signals AFACT<0:7>.

The active control circuit 304 may include a storage unit 305 and a time division output unit 306.

The storage unit 305 may store the internal address iADD corresponding to the active command ACT as a latch address ADD_LT.

The time division output unit 306 may perform an operation for preventing row hammering.

The row hammering may indicate that a characteristic is degraded by stress caused by consecutive accesses to a specific row.

Thus, in order to prevent consecutive accesses to a row address which is enabled according to the active command ACT, the time division output unit 306 may store a row address during the previous active operation, and vary the corresponding address value to activate the address, during a subsequent active operation (for example, a refresh operation). At this time, the time division output unit 306 may vary the address value by adding a value of '1' to the corresponding address.

The time division output unit 306 may process a signal for activating a word line in a time division manner according to the plurality of refresh timing signals AFACT<0:7>, the word line corresponding to an address obtained by varying the value of the latch address ADD_LT, and output the processed signals as the active signals RACT<0:7>.

Figure 4:
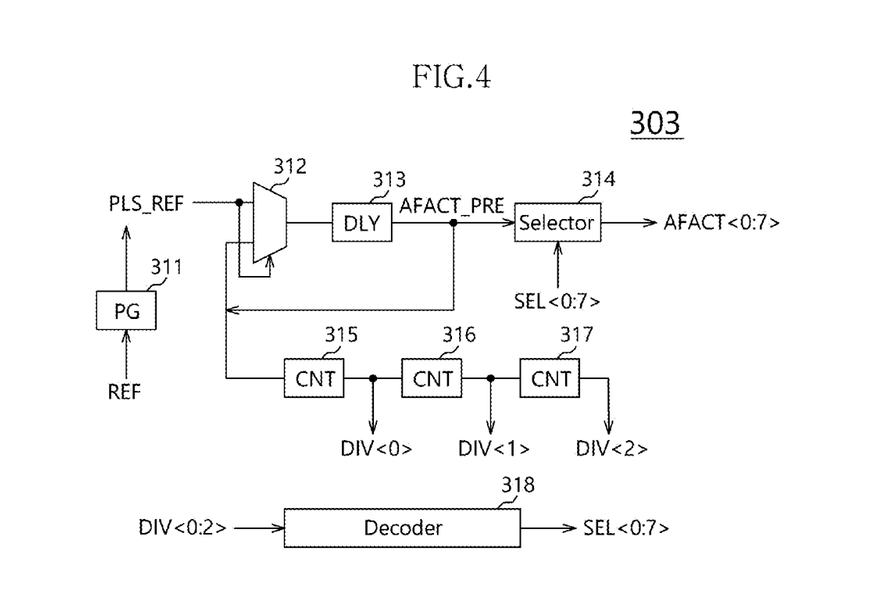
FIG. 4 is a diagram illustrating a representation of an example of a configuration of a refresh timing generation circuit of FIG. 3.
Figure 5:
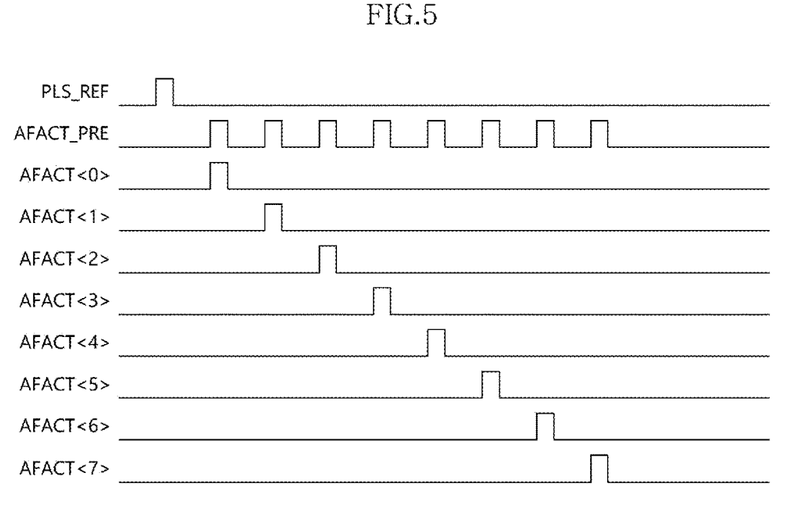
FIG. 5 is an operation timing diagram of FIG. 4.

Referring to FIGS. 4 and 5, the refresh timing generation circuit 303 may include a pulse generator 311, a multiplexer 312, a delay 313, a selector 314, first to third counters 315 to 317 and a decoder 318.

The pulse generator 311 may generate a refresh pulse PLS_REF according to the refresh command REF.

The multiplexer 312 may select and output one of the refresh pulse PLS_REF and the pre-refresh timing signal AFACT_PRE according to a control signal, that is, the refresh pulse PLS_REF.

The delay 313 may delay the output of the multiplexer 312 by a preset time, and output the delayed signal as the pre-refresh timing signal AFACT_PRE.

The multiplexer 312 may select and output the refresh pulse PLS_REF as the refresh pulse PLS_REF is activated, that is, at a rising edge of the refresh pulse PLS_REF.

Then, the multiplexer 312 may select and output the pre-refresh timing signal AFACT_PRE after the refresh pulse PLS_REF is deactivated, that is, at a falling edge of the refresh pulse PLS_REF.

Thus, the pre-refresh timing signal AFACT_PRE may be repetitively passed through a feedback loop, that is, the multiplexer 312 and the delay 313, thereby having a plurality of pulses.

The selector 314 may select the pulses of the pre-refresh timing signal AFACT_PRE according to a select control signal SEL<0:7>, and generate the plurality of refresh timing signals AFACT<0:7> which are sequentially enabled with a time difference therebetween, the time difference corresponding to the delay time of the delay 313.

The first to third counters 315 to 317 may generate a count signal DIV<0:2> by sequentially counting the pre-refresh timing signal AFACT_PRE.

The decoder 318 may generate the select control signal SEL<0:7> by decoding the count signal DIV<0:2>.

The refresh timing generation circuit 303 can generate the plurality of refresh timing signals AFACT<0:7> using only one delay 313 which requires a larger circuit area than other logic elements. Therefore, the circuit area required for refresh timing control can be reduced.

Figure 6:
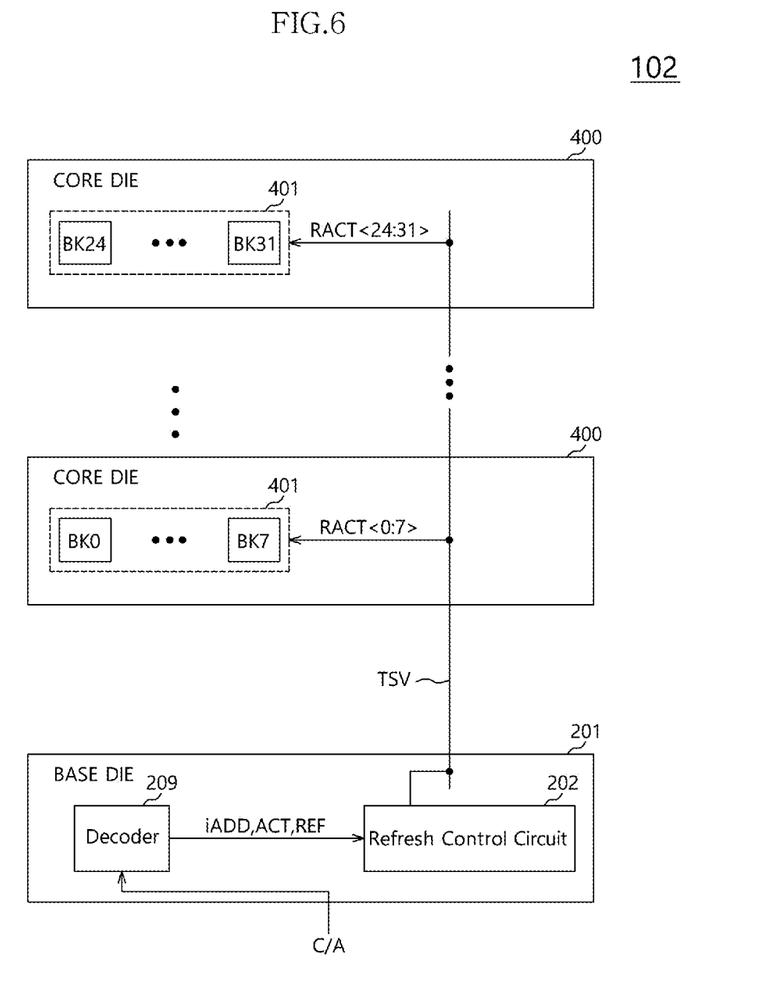
FIG. 6 is a diagram illustrating a representation of an example of a configuration of a semiconductor apparatus according to an embodiment.

Referring to FIG. 6, a semiconductor apparatus including a semiconductor memory 102 according to an embodiment may include a base die 201 and a plurality of core dies 400.

Each of the core dies 400 may include a memory region 401.

The memory region 401 may include a plurality of memory blocks, for example, a plurality of memory banks BK.

FIG. 6 indicates for example that the semiconductor memory includes four core dies 400 and each of the core dies 400 includes seven memory banks BK. Thus, the memory banks for each core die 400 include, respectively, memory banks BK0 to BK7, BK8 to BK15, BK16 to BK23, and BK24 to BK31.

The plurality of memory banks BK0 to BK31 may sequentially perform refresh operations according to active signals RACT<0:31>.

For example, the plurality of memory banks BK0 to BK31 may perform refresh operations in order of BK0, BK1, . . . , BK31.

The base die 201 may generate the active signals RACT<0:31> which are enabled with a preset time difference therebetween, according to a command/address signal C/A which is inputted through an external pin.

The base die 201 may include a decoder 209 and a refresh control circuit 202.

The decoder 209 may generate an internal address iADD, an active command ACT and a refresh command REF by decoding the command/address signal C/A.

The refresh control circuit 202 may generate the active signals RACT<0:31> which are enabled with the preset time difference therebetween, according to the internal address iADD, the active command ACT and the refresh command REF.

The active signals RACT<0:31> are row active signals for activating predetermined word lines of the respective memory banks BK0 to BK31.

For example, the active signals RACT<0:31> may be enabled with the preset time difference therebetween in order of RACT0, RACT1, . . . , RACT31.

The base die 201 may provide the active signals RACT<0:31> to the plurality of core dies 400 through a plurality of through-electrodes, for example, TSVs.

Figure 7:
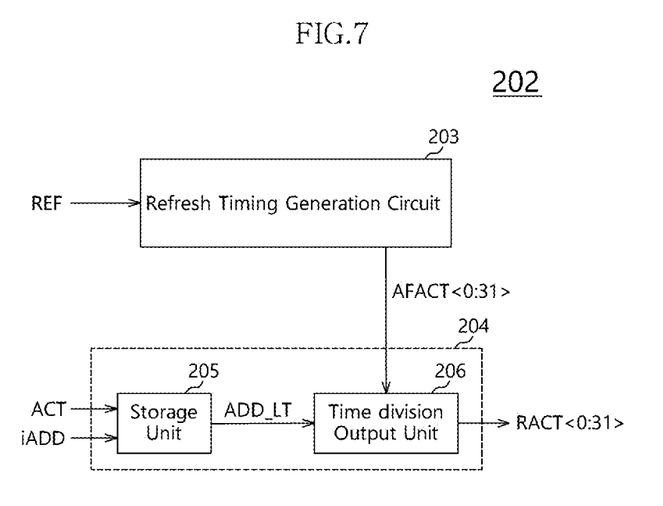
FIG. 7 is a diagram illustrating a representation of an example of a configuration of a refresh control unit of FIG. 6.

Referring to FIG. 7, the refresh control circuit 202 may include a refresh timing generation circuit 203 and an active control circuit 204.

The refresh timing generation circuit 203 may generate a pre-refresh timing signal by repetitively delaying a pulse signal through a feedback loop passing through a delay, the pulse signal being generated according to the refresh command REF. Then, the refresh timing generation circuit 203 may select pulses of the pre-refresh timing signal according to a preset order, and output the selected pulses as a plurality of refresh timing signals AFACT<0:31>.

The active control circuit 204 may store an internal address iADD corresponding to an active command ACT, vary the value of the stored address, and output the varied address as the active signals RACT<0:31> which are processed in a time division manner according to the plurality of refresh timing signals AFACT<0:31>.

The active control circuit 204 may include a storage unit 205 and a time division output unit 206.

The storage unit 205 may store the internal address iADD corresponding to the active command ACT as a latch address ADD_LT.

The time division output unit 206 may process a signal for activating a word line in a timesharing manner according to a plurality of refresh timing signals AFACT<0:31>, the word line corresponding to an address obtained by varying the value of a latch address ADD_LT, and output the processed signals as the active signals RACT<0:31>.

The time division output unit 206 may perform an operation for preventing row hammering.

In order to prevent consecutive accesses to a row address which is enabled according to the active command ACT, the time division output unit 206 may store a row address during the previous active operation, and vary the corresponding address value to activate the address, during a subsequent active operation (for example, a refresh operation). At this time, the time division output unit 206 may vary the address value by adding a value of '1' to the corresponding address.

Figure 8:
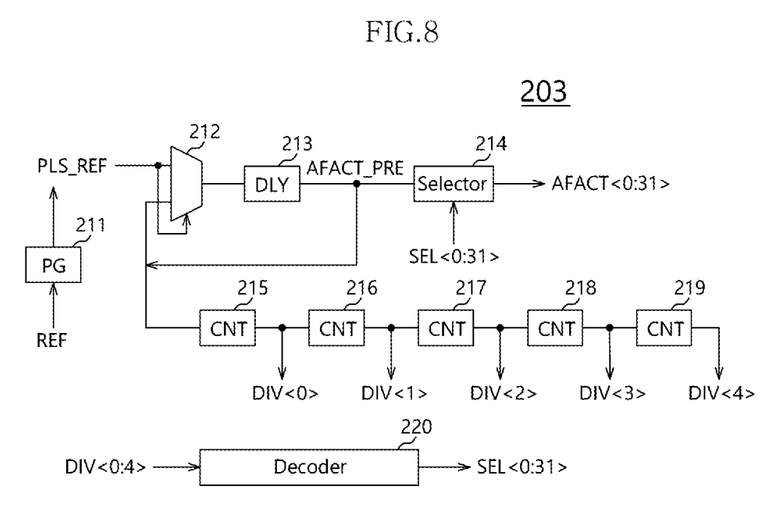
FIG. 8 is a diagram illustrating a representation of an example of a configuration of a refresh timing generation circuit of FIG. 7.

Referring to FIG. 8, the refresh timing generation circuit 203 may include a pulse generator 211, a multiplexer 212, a delay 213, a selector 214, first to fifth counters 215 to 219 and a decoder 220.

The pulse generator 211 may generate a refresh pulse PLS_REF according to the refresh command REF.

The multiplexer 212 may select and output one of the refresh pulse PLS_REF and the pre-refresh timing signal AFACT_PRE according to a control signal, that is, the refresh pulse PLS_REF.

The delay 213 may delay the output of the multiplexer 212 by a preset time, and output the delayed signal as the pre-refresh timing signal AFACT_PRE.

At this time, the multiplexer 212 may select and output the refresh pulse PLS_REF as the refresh pulse PLS_REF is activated, that is, at a rising edge of the refresh pulse PLS_REF.

Then, the multiplexer 212 may select and output the pre-refresh timing signal AFACT_PRE after the refresh pulse PLS_REF is deactivated, that is, at a falling edge of the refresh pulse PLS_REF.

Thus, the pre-refresh timing signal AFACT_PRE may be repetitively passed through a feedback loop, that is, the multiplexer 212 and the delay 213, thereby having a plurality of pulses.

The selector 214 may select the pulses of the pre-refresh timing signal AFACT_PRE according to a select control signal SEL<0:31>, and generate a plurality of refresh timing signals AFACT<0:31> which are sequentially enabled with a time difference therebetween, the time difference corresponding to the delay time of the delay 213.

The first to fifth counters 215 to 219 may generate a count signal DIV<0:4> by sequentially counting the pre-refresh timing signal AFACT_PRE.

The decoder 220 may generate the select control signal SEL<0:31> by decoding the count signal DIV<0:4>.

The refresh timing generation circuit 203 may generate the plurality of refresh timing signals AFACT<0:31> using only one delay 213 which requires a larger circuit area than other logic elements. Therefore, the circuit area for refresh timing control can be reduced.

The refresh timing generation circuits, refresh control circuits, and or semiconductor apparatus as discussed above (see FIGS. 1-8) are particular useful in the design of other memory devices, processors, and computer systems. For example, referring to FIG. 9, a block diagram of a system employing a refresh timing generation circuit, refresh control circuit, and or semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 9:
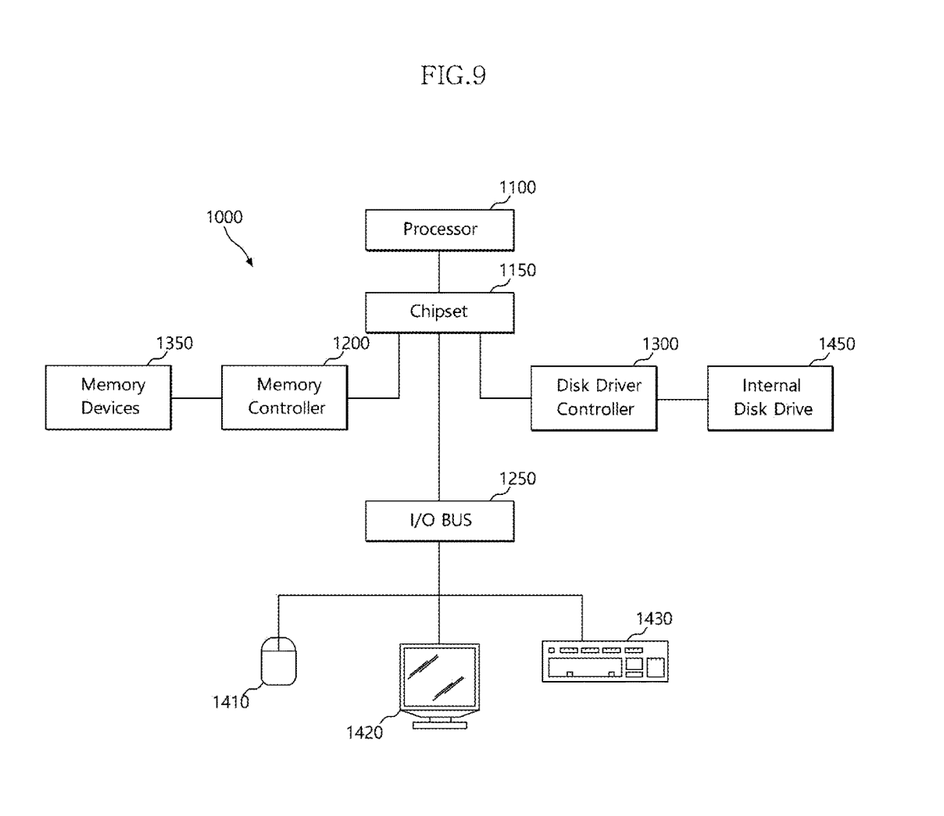
FIG. 9 illustrates a block diagram of an example of a representation of a system employing a refresh timing generation circuit, refresh control circuit, and or semiconductor apparatus with the various embodiments discussed above with relation to FIGS. 1-8.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one refresh timing generation circuit, refresh control circuit, and or semiconductor apparatus as discussed above with reference to FIGS. 1-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one refresh timing generation circuit, refresh control circuit, and or semiconductor apparatus as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a refresh timing generation circuit, refresh control circuit, and or semiconductor apparatus as discussed above with relation to FIGS. 1-8. In alternate embodiments, such as, for example but not limited to, cellular phones or digital cameras, the components may differ from the embodiments illustrated in FIG. 9.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A refresh timing generation circuit comprising:
   a multiplexer configured to select and output one of a refresh pulse and a pre-refresh timing signal according to the refresh pulse;
   a delay configured to delay the output of the multiplexer by a preset time and output the delayed signals as the pre-refresh timing signal;
   a selector configured to generate a plurality of refresh timing signals by selecting pulses of the pre-refresh timing signal according to a select control signal; and
   a decoder configured to generate the select control signal according to the pre-refresh timing signal.

2. The refresh timing generation circuit according to claim 1, wherein only one delay is used to generate the plurality of refresh timing signals.

3. The refresh timing generation circuit according to claim 1, wherein the refresh timing signals are sequentially enabled with a time difference there between, the time difference corresponding to a delay time of the delay.

4. A refresh control circuit comprising:
   a multiplexer configured to select and output one of a refresh pulse and a pre-refresh timing signal according to the refresh pulse;
   a delay configured to delay the output of the multiplexer by a preset time and output the delayed signals as the pre-refresh timing signal;
   a selector configured to generate a plurality of refresh timing signals by selecting pulses of the pre-refresh timing signal according to a select control signal;
   a decoder configured to generate the select control signal according to the pre-refresh timing signal; and
   an active control circuit configured to store an internal address corresponding to an active command, vary the value of the stored address, and output the varied address as an active signal processed in a time division manner according to the plurality of refresh timing signals.

5. The refresh control circuit according to claim 4, wherein the active control circuit adds a predetermined value to the value of the stored address, and outputs the resultant signal as the active signal processed in a time division manner according to the plurality of refresh timing signals.

6. The refresh control circuit according to claim 4, wherein only one delay is included in the feedback loop and is used to generate the plurality of refresh timing signals.

7. The refresh control circuit according to claim 4, wherein the refresh timing signals are sequentially enabled with a time difference there between, the time difference corresponding to a delay time of the delay.

8. A semiconductor apparatus comprising:
   a base die; and
   a plurality of core dies stacked over the base die, and each comprising a plurality of memory blocks,
   wherein either the base die or each of the core dies comprises a refresh timing generation circuit configured to repetitively delay a refresh pulse through a feedback loop including a delay to generate delayed signals, the refresh pulse signal being generated according to a refresh command, and output the delayed signals as a plurality of refresh timing signals,
   wherein when only the core dies comprise the refresh timing generation circuit, each of the core dies further comprises a decoder configured to generate an internal address, an active command and the refresh command by decoding a command and address (command/address) signal inputted from outside the core die, and
wherein the base die is configured to provide the command/address signal to the plurality of core dies via through-electrodes.

9. The semiconductor apparatus according to claim 8, wherein when only the core dies comprise the refresh timing generation circuit, each of the core dies further comprises an active control circuit configured to store an internal address corresponding to an active command, process the stored address in a time division manner according to the plurality of refresh timing signals by varying the value of the stored address, and output the processed signal as an active signal for sequentially activating the plurality of memory blocks.

10. The semiconductor apparatus according to claim 9, wherein the active control circuit adds a predetermined value to the value of the stored address, and outputs the resultant signal as the active signal processed in a time division manner according to the plurality of refresh timing signals.

11. The semiconductor apparatus according to claim 8, wherein when only the base die comprise the refresh timing generation circuit, the base die further comprises an active control circuit configured to store an internal address corresponding to an active command, process the stored address in a time division manner according to the plurality of refresh timing signals by varying the value of the stored address, and output the processed signal as an active signal for sequentially activating the plurality of memory blocks.

12. The semiconductor apparatus according to claim 11, wherein the active control circuit adds a predetermined value to the value of the stored address, and outputs the resultant signal as the active signal processed in a time division manner according to the plurality of refresh timing signals.

13. The semiconductor apparatus according to claim 8, wherein when only the base die comprise the refresh timing generation circuit, the base die comprises a decoder configured to generate an internal address, an active command and the refresh command by decoding a command/address signal inputted from outside the base die.

14. The semiconductor apparatus according to claim 11, wherein the base die is configured to provide the active signal to the plurality of core dies via through-electrodes.

15. The semiconductor apparatus according to claim 11, wherein the base die divides and provides the active signal to the respective memory blocks of the plurality of core dies.

16. The semiconductor apparatus according to claim 8, wherein only one delay is included in the feedback loop and is used to generate the plurality of refresh timing signals.

17. The semiconductor apparatus according to claim 8, wherein the refresh timing signals are sequentially enabled with a time difference there between, the time difference corresponding to a delay time of a delay.

* * * * *

UNITED STATES PATENT AND TRADEMARK OFFICE
CERTIFICATE OF CORRECTION

Page 1 of 1

PATENT NO. : 10,062,428 B2
APPLICATION NO. : 15/462989
DATED : August 28, 2018
INVENTOR(S) : Hyun Sung Lee It is certified that error appears in the above-identified patent and that said Letters Patent is hereby corrected as shown below:

On the Title Page

Item (71) Applicant:
Replace "SK hynix Inc., Incheon-si, Gyeonggi-do (KR)" with --SK hynix Inc., Icheon-si, Gyeonggi-do (KR)--

Item (72) Inventor:
Replace "Hyun Sung LEE, Incheon-si (KR)" with --Hyun Sung LEE, Icheon-si (KR)--

Signed and Sealed this
Fifth Day of February, 2019

Andrei Iancu
*Director of the United States Patent and Trademark Office*